United States Patent [19]

Chau et al.

[11] Patent Number: 4,658,158

[45] Date of Patent: Apr. 14, 1987

[54] VOLTAGE SENSE AMPLIFIER USING NMOS

[75] Inventors: Ngaiman Chau, Flintridge; John W. Wu, Torrance; Neng-Tze Yang, Rancho Palos Verdes; Eugene J. Mar, Sunnyvale, all of Calif.

[73] Assignee: Xerox Corporation, Stamford, Conn.

[21] Appl. No.: 165,518

[22] Filed: Jul. 3, 1980

[51] Int. Cl.[4] .......................... H03K 5/24; G11C 7/06; G11C 11/40
[52] U.S. Cl. .................................... 307/530; 307/362; 307/518; 365/207; 365/182
[58] Field of Search ............... 307/350, 362, 530, 304, 307/518; 365/182, 188, 205, 207, 208; 340/661; 328/146, 147, 150

[56] References Cited

U.S. PATENT DOCUMENTS

| 3,993,917 | 11/1976 | Kalter | 307/530 |
| 4,004,240 | 1/1977 | Crowle | 330/275 |
| 4,096,402 | 6/1978 | Schroeder et al. | 307/362 |
| 4,277,702 | 7/1981 | Hamilton et al. | 307/362 |

Primary Examiner—John Zazworsky
Attorney, Agent, or Firm—Robert E. Cunha

[57] ABSTRACT

In a high-density VLSI NMOS semiconductor such as a ROM, a voltage sensing mode amplifier in the output thereof, operative to sense relatively very low input signal swing bit read signals from the ROM with relative insensitivity to fabrication process variation. The structure includes a common gate amplifier for receiving the ROM signal, a very sensitive reference voltage circuit, a two-stage differential digital switching module operative to compatively receive the common gate and voltage reference signals to effectively distinguish relatively weak bit signals as read from the high-density VLSI ROM.

5 Claims, 10 Drawing Figures

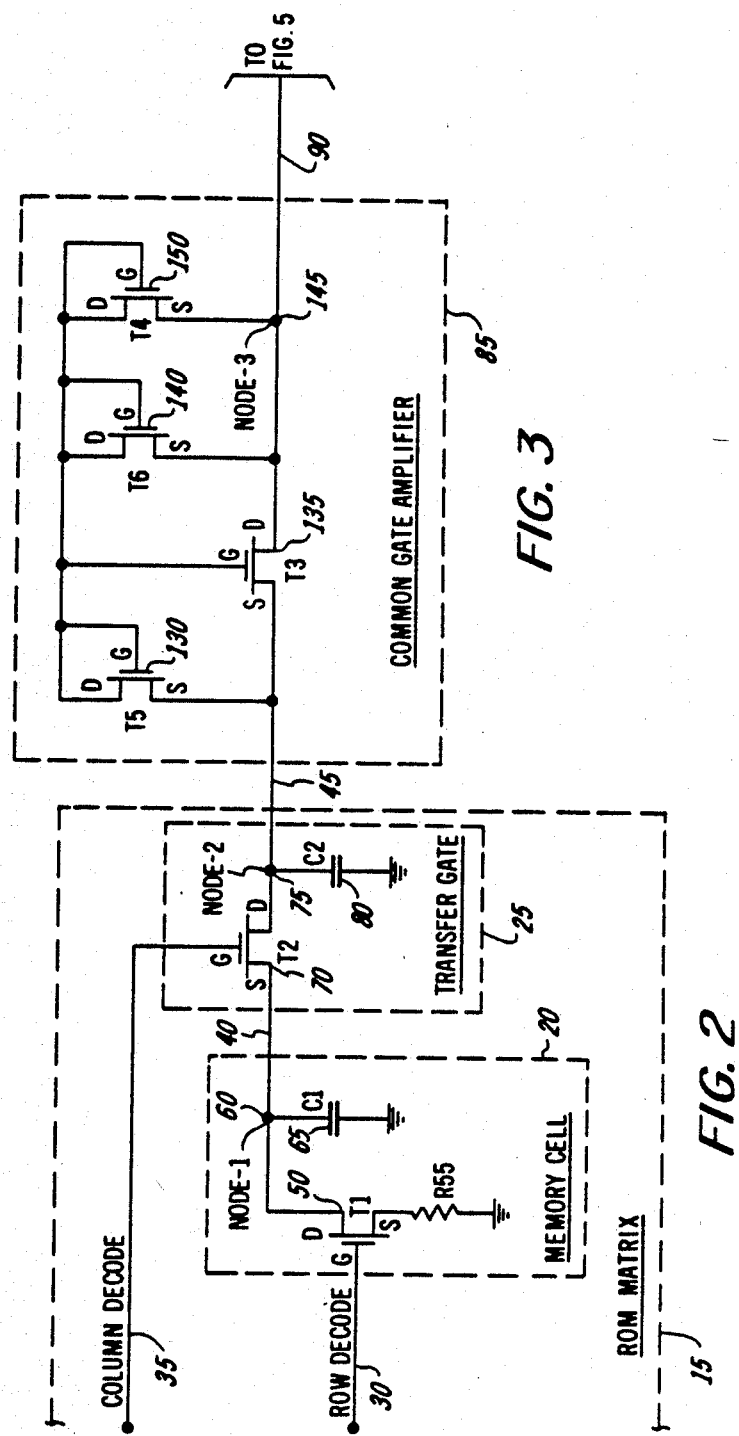

SUMMING OF SENSE AMPLIFIER SIMULATIONS

| PROCESS | WE | WE | WE | WE | BE | BE | BE | BE |
|---|---|---|---|---|---|---|---|---|
| PARAMETER | WD | WD | BD | BD | BD | BD | WD | WD |
| $V_{CC}$ | 4.5 | 5.5 | 4.5 | 5.5 | 4.5 | 5.5 | 4.5 | 5.5 |
| T(RISE) | 210NS | 160NS | 185NS | 158NS | 101NS | 90NS | 113NS | 106NS |
| T(FALL) | 185NS | 210NS | 118NS | 104NS | 122NS | 115NS | 206NS | 181NS |

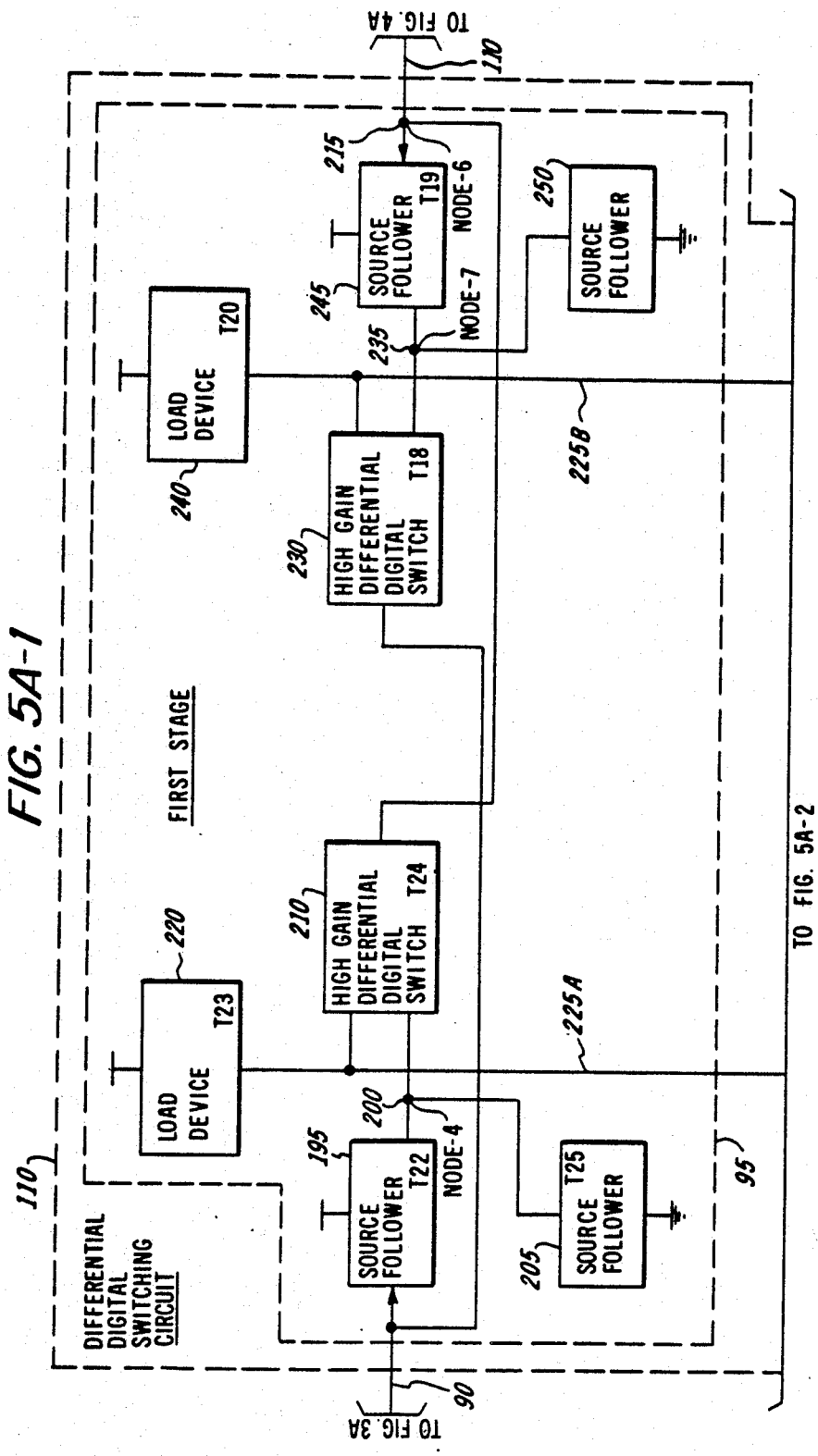

VOLTAGE SENSE AMPLIFIER USING NMOS

BACKGROUND OF THE INVENTION

1. Field of the Invention

This invention relates generally to the field of semiconductor memories and specifically to sensing amplifiers therefor.

2. Prior Art

In semiconductor memory device design, the sensing amplifier has always been the most important and critical part of the design. Due to the large loading capacitance on the internal bit line and the associated external data bus, the charging and discharging time of the bit line has inherently been very slow, which limited the sensing speed of the static memory when a conventional differential amplifier and/or a common source amplifier in the front stage of the sensing amplifier was used. The former has the difficulties of first having an output swing from the differential amplifier that is very limited with the currently used five volt power supply, and secondly, it takes a relatively large input signal swing which means longer charging and discharging time of the bit line.

In the latter case, the common source amplifier can be made to be cascaded in stages with feedback thus allowing relatively fast sensing, but it is prone to having an instability problem due to a high open loop gain and a relatively long feedback path. In addition, it is relatively sensitive to fabrication processing variation which becomes critical as ROM density approach VLSI.

SUMMARY OF THE INVENTION

Accordingly, it is an object of the present invention to provide a relatively extremely sensitive sensing amplifier for a relatively high-density semiconductor memory such as a ROM for effectively sensing relatively weak bit signals outputted as addressed in the ROM.

A further object of the invention is to provide a common gate amplifier for receiving the ROM signal for amplification without being subject to process fabrication variation.

Another further object of the invention is to provide a reference voltage circuit that is extremely stable for referring to the amplified ROM signal outputted by the common gate amplifier.

Yet another object of the invention is to provide a differential digital switching module to compare the amplified ROM signal from the common gate amplifier with the reference signal from the reference voltage circuit for distinguishing relatively weak signal switching outputs read from the ROM.

A yet further object of the invention is to provide a spatial matching of components as between the common gate amplifier and the reference voltage circuit for enhancing the insensitivity to process fabrication variation.

A yet another further object of the invention is to provide a first stage in the differential digital switching module having a pair of high-gain differential digital switches that are cross-connected for extremely high sensitivity to amplified ROM read sigal having relatively low input signal switchings.

BRIEF DESCRIPTION OF THE DRAWINGS

FIG. 2 is a schematic diagram of the ROM matrix of the sensing amplifier system of FIG. 1;

FIG. 3 is a schematic diagram of the common gate amplifier of FIG. 1;

FIGS. 5A-1 and 5A-2 are a block diagram of the differential digital switching circuit of FIG. 1.

DESCRIPTION OF THE PREFERRED EMBODIMENT

Figure 1:
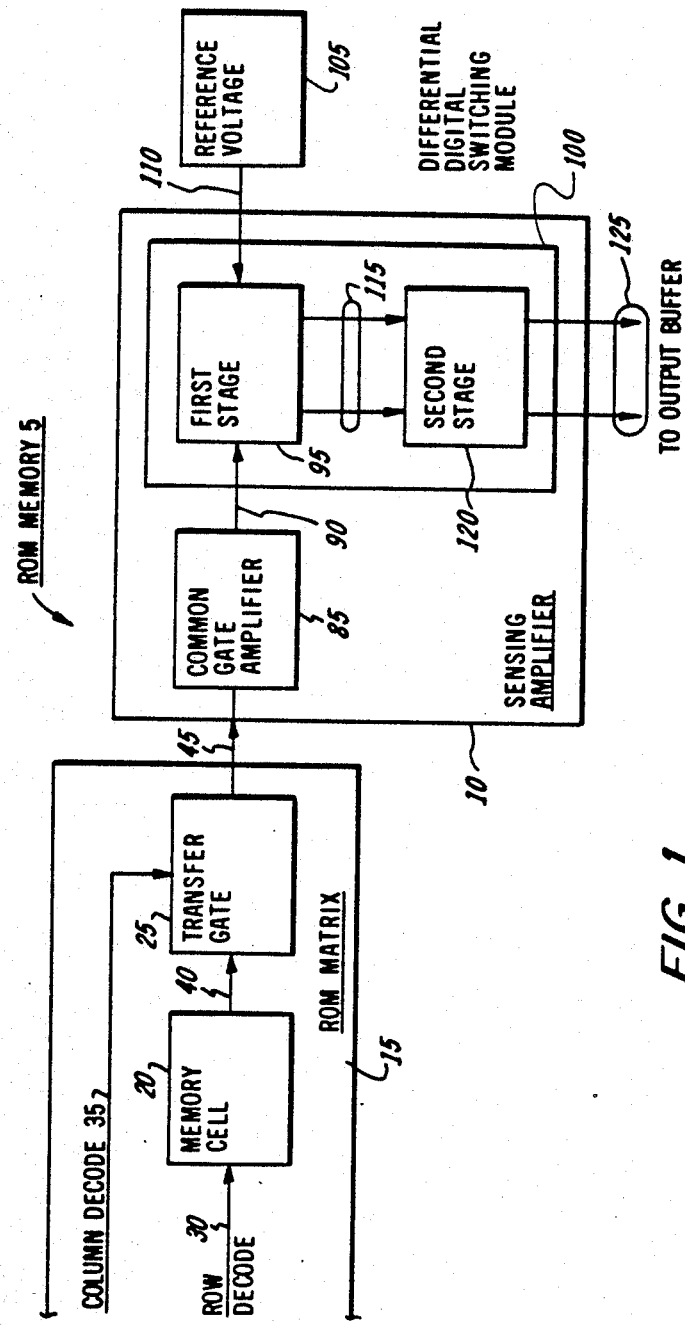
FIG. 1 is a block diagram of a ROM memory having a sensing amplifier system with a common gate amplifier and a two stage differential digital switching module as used in the present invention.

In a generalized microelectronics memory structure 5 operative to use the inventive sensing amplifier 10, as shown generally in FIG. 1 and specifically in FIGS. 2-6, the semiconductor memory structure or high-density NMOS memory 5 may be a read-only-memory (ROM) as in the present invention, but could be equally applicable to a random-access-memory (RAM) (not shown) where output signal strength becomes relatively weak as circuit density therein approaches verylarge-scale-integration (VLSI). In the present invention there is used a typical, prior art ROM matrix or memory matrix 15 in the ROM memory 5 comprising a memory cell 20 that is replicated as many times as the given bits for the memory, which is 128,000 (128 K) in the present invention, and a transfer gate 25 that is unique to a given row of memory cells 20. In a typical READ operation, a row of memory cells 20 is activated by a row decode signal on line 30 from a row decoder (not shown) in the ROM memory 5 and temporally relatively simultaneously a column decode signal on line 35 from a column decoder (not shown) in the ROM memory 5 will activate a given transfer gate 25 to receive a memory cell signal on line 40 for outputting from the ROM matrix 15 on line 45, where there is a unique transfer gate 25 per each memory cell 20 in a row that is called out at any given time. Thus for a given row decode signal 30 and column decode signal 35, a unique memory cell 20 can be called out to be outputted by the transfer gate 25 to be amplified by the sensing amplifier 10.

Figure 5:
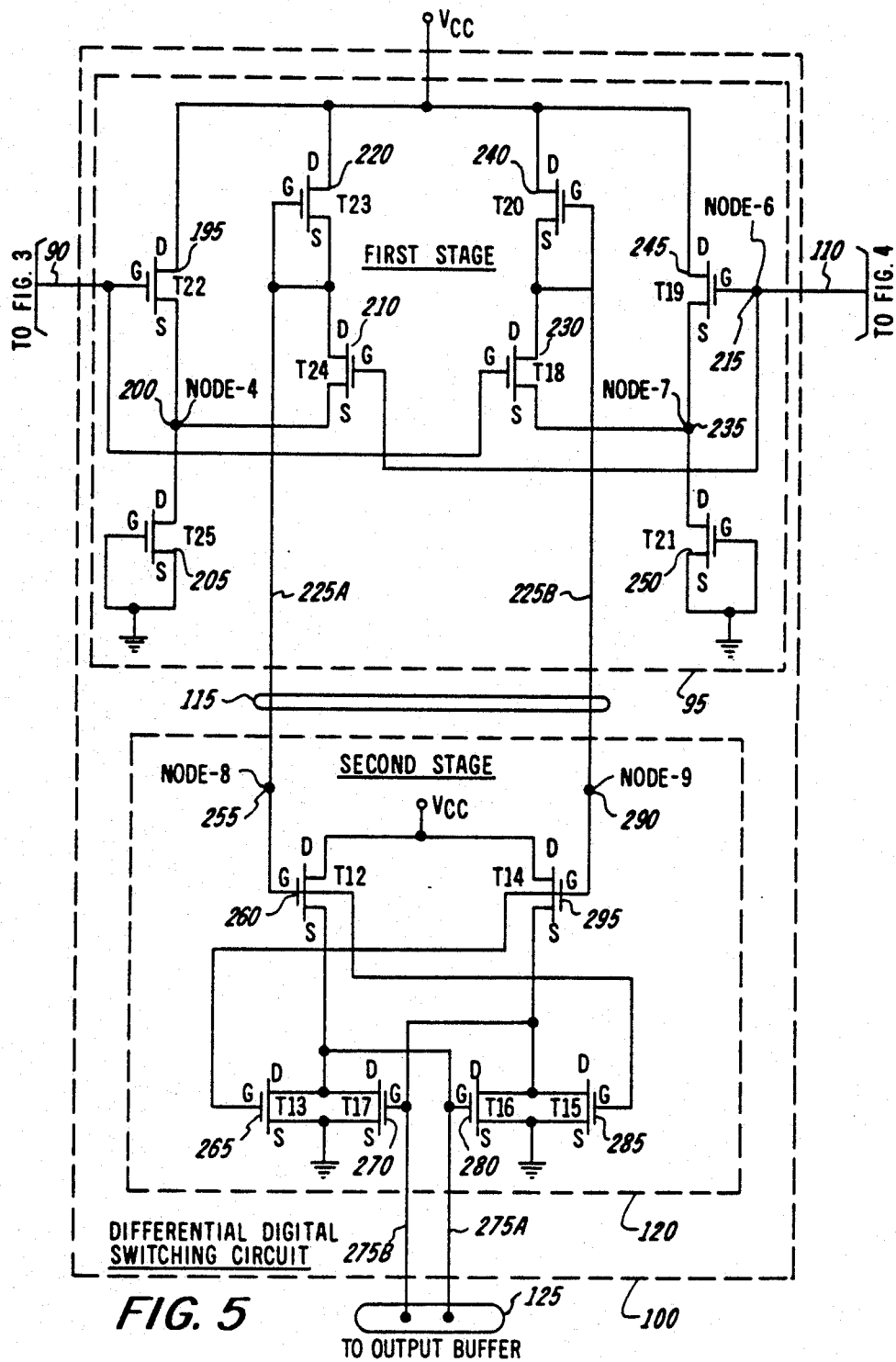
FIG. 5 is a schematic diagram of the differential digital switching circuit of FIG. 1.
Figures 2, 5A:
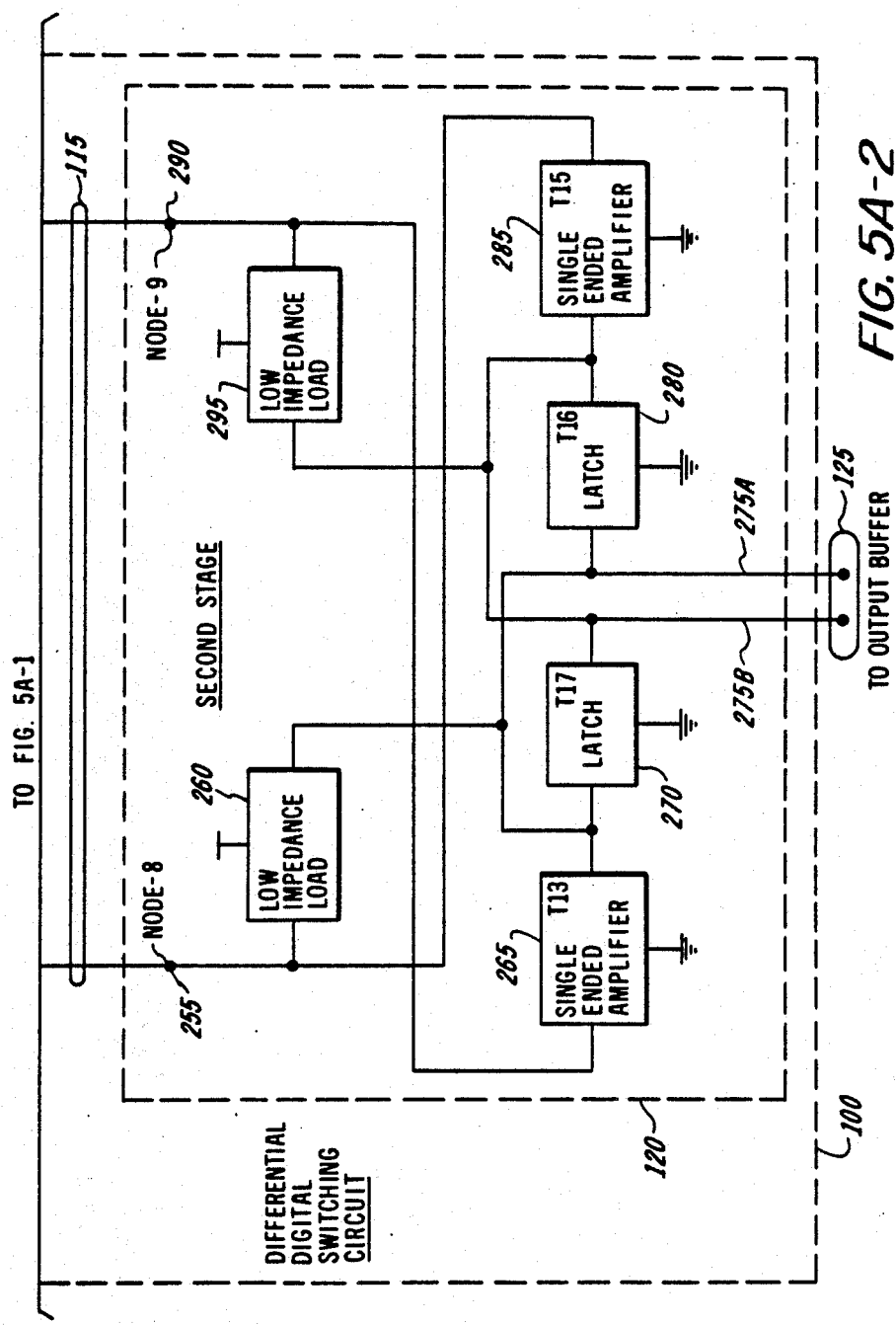

In a specific structure, as shown in FIG. 2, for a prior art ROM matrix 15, the typical memory cell 20 is comprised of an enhancement mode MOSFET transistor (T1) 50 operative to receive, as a control signal input, a row decode signal on line 30 on its gate (G). It is also connected to, through its source (S), to ground through resistor (R) 55. Resistor (R) 55 embodies the inherent given resistance in the memory cell 20. The drain (D) of transistor (T1) serving as the output port is connected to node-1 (60). Grounded capacitor (C1) 65 is also connected to node-1 (60) and embodies the inherent given capacitance of the memory cell 20. The typical transfer gate 25 is comprised of an enhancement mode MOSFET transistor (T2) 70 operative to receive, as a control signal input, the output signal on line 40 from the memory cell 20 at its source (S). The transistor (T2) 70 is also operative to receive the column decode signal on line 35 at its gate (G). The transistor (T2) 70 outputs at its drain (D) to node-2 (75). Also connected to node-2 (75) is grounded capacitor (C2) 80 which embodies the inherent given capacitance in the transfer gate 25. Node-2 (75) is operative to output as line 45 to the common gate amplifier 85.

In the generalized structure for the sensing amplifier 10, as shown in FIG. 1, a common gate amplifier 85 in the sensing amplifier 10 is operative to receive a signal on line 45 from the transfer gate 25 of the ROM matrix 15 which in turn outputs an amplified version thereof on line 90 to a first stage 95 of a differential digital switching circuit 100. A reference voltage circuit 105 supplying a given reference voltage on line 110 is also operative to input to the first stage 95 of the differential digital switching circuit 100. The first stage 95 is operative upon receipt of signals on lines 90 and 110 from the common gate amplifier 85 and reference voltage circuit 105, respectively, to output a signal set 115 to a second stage 120 of the differential digital switching circuit 100. The second stage 120 of the differential digital swtiching circuit 100 is operative upon receipt of the signal set 115 to, in turn, output its own signal set on line set 125 to an output buffer (not shown) that may be onboard (as in this embodiment) or off-board the chip of the ROM memory 5.

Figure 3A:
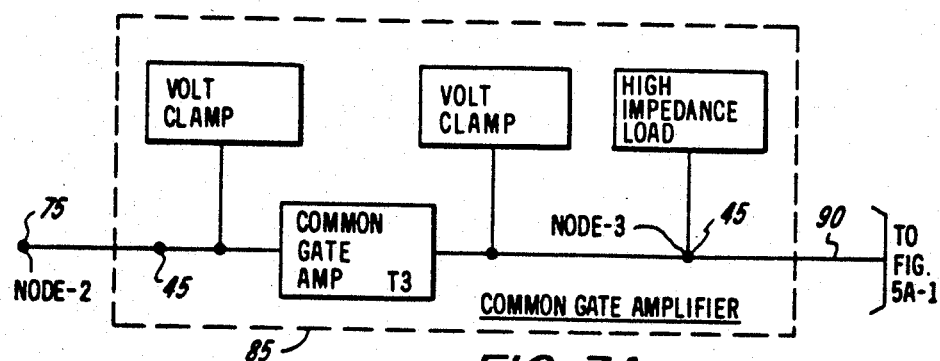
FIG. 3A is a block diagram of the common gate amplifier of FIG. 1.

In the specific structure for the common gate amplifier 85, as shown in FIGS. 3 and 3A, the signal on line 45 from the transfer gate 25 of the ROM matrix 15 is bifurcatably inputted thereto first to the source (S) of an enhancement mode MOSFET transistor (T5) 130 that functions as a voltage clamp and secondly to the source (S) of an enhancement mode MOSFET transistor (T3) 135 that functions as common gate amplifier per se. The drain (D) and gate (G) of transistor (T5) 130 are both operatively connected to a predetermined Vcc power supply which in this embodiment is five volts DC. The gate (G) of transistor (T3) is also tied to the predetermined Vcc power supply. The output or drain (D) of the transistor (T3) 135 bifurcates first to the source (S) of an enhancement mode MOSFET transistor (T6) 140 that functions as a voltage clamp, and secondly to a node-3 (145). The drain (D) and gate (G) of the transistor (T6) are each tried to the predetermined Vcc power supply. The node-3 (145) is operative to bifurcate first to the source (S) of a depletion mode MOSFET transistor (T4) 150 that functions as a relatively high impedance load and secondly as the output line 90 to the first stage 195 of the differential digital switching circuit 110 of FIG. 5. The drain (D) and gate (G) of the transistor (T4) 150, FIG. 3, are each operative to be connected to the predetermined Vcc power supply.

Figure 4A:
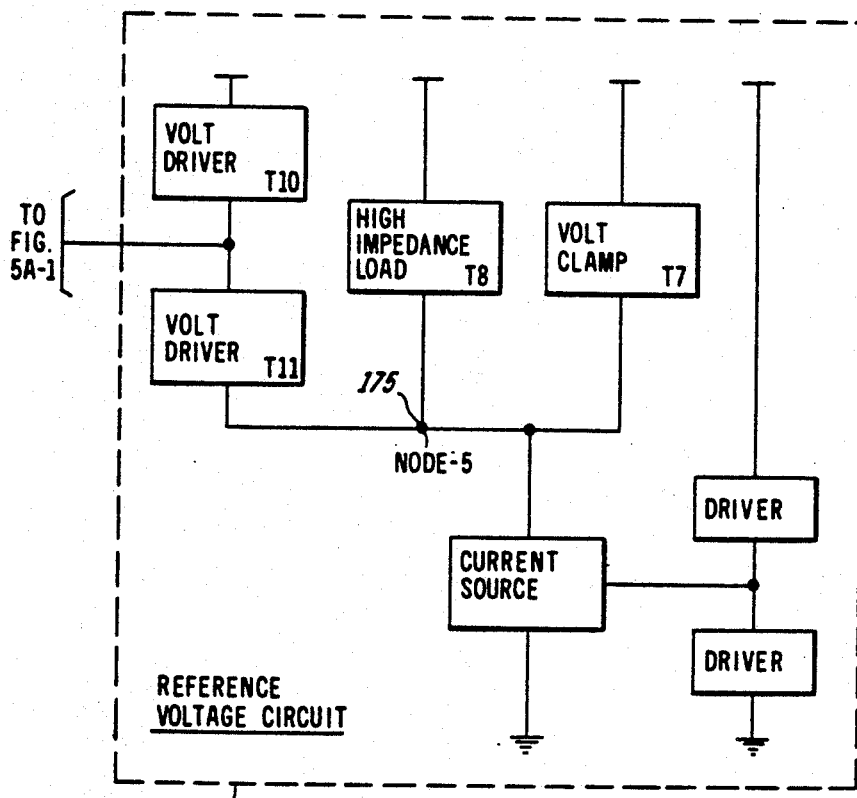
FIG. 4A is a block diagram of the reference voltage circuit of FIG. 1.
Figures 4, 6:
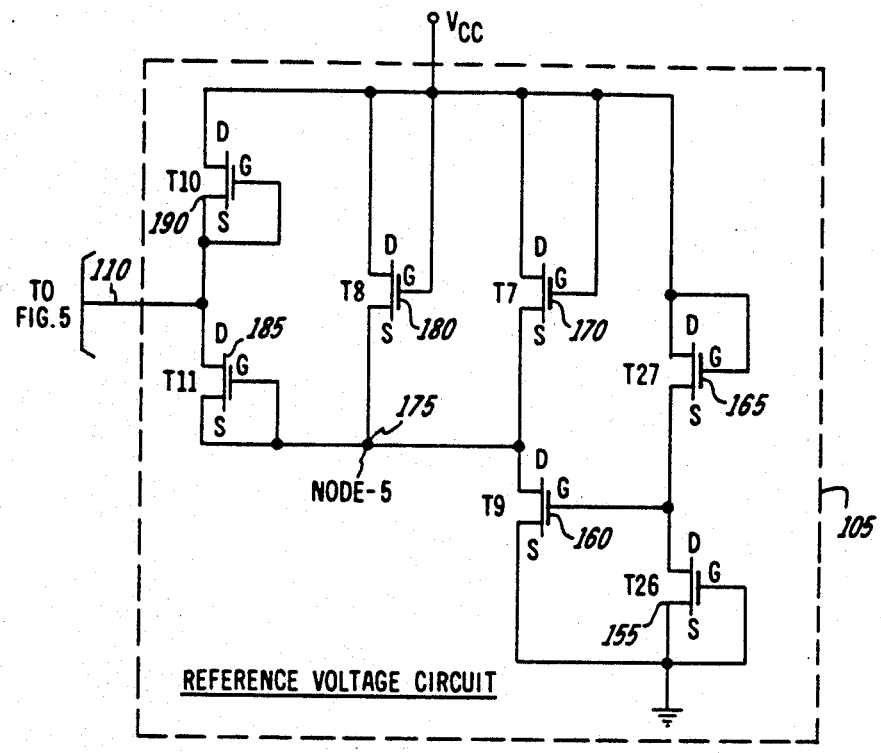
FIG. 4 is a schematic diagram of the reference voltage circuit of FIG. 1.
FIG. 6 is a table of the results of a simulation of the sensing anplifier of the present invention under various process parameters.

In the specific structure for the reference voltage circuit 105, as shown in FIGS. 4 and 4A, a depletion mode MOSFET transistor (T26) that functions as a driver 155, is operative to have its source (S) and gate (G) connected to ground. The drain (D) of transistor (T26) 155 is bifurcated first to the gate (G) of an enhancement mode MOSFET transistor (T9) 160 that functions as a current source, secondly to the source (S) of an enhancement mode MOSFET transistor (T27) 165 that functions as a driver. The source (S) of the transistor (T9) 160 is also operatively connected to ground. The drain (D) and gate (G) of the transistor (T27) 165 are operatively connected to the predetermined Vcc power supply. The drain (D) of the transistor (T9) 160 bifurcates first to the source (S) of an enhancement mode MOSFET transistor (T7) 170 that functions as a voltage clamp, and secondly to a node-5 (175). The drain (D) and gate (G) of the transistor (T7) 170 are each operative to be connected to the predetermined Vcc power supply. Node-5 (175) bifurcates first to the source (S) of the depletion mode MOSFET transistor (T8) 180 that functions as a high impedance load, and secondly to the gate (G) and source (S) of a depletion mode MOSFET transistor (T11) 185 that functions as part of a voltage divider along with transistor 190. The drain (D) and gate (G) of transistor 180 are operatively connected to the predetermined Vcc power supply. The drain (D) of transistor (T11) 185 is operative to be the first leg or connection of the bifurcated line 110 to the first stage 95, FIG. 5, of the differential digital swtiching circuit 100. The second leg or connection of the bifurcated line 110 being to the source (S) and gate (G) of a depletion mode MOSFET transistor (T10) 190 FIG. 4 that functions as part of a voltage divider, the drain (D) of the transistor (T10) 190 being operatively connected to the predetermined Vcc power supply.

In the specific structure for the first stage 95 of the differential digital switching circuit 100, as shown in FIGS. 5, 5A-1 and 5A-2, an enhancement mode MOSFET transistor (T22) 195 that functions as a source follower is operative to receive a signal at its gate (G) on line 90 from the common gate amplifier 85, FIG. 1,. The drain (D) of the transistor (T22), FIG. 5, is operatively connected to the predetermined Vcc power supply. The source (S) of the transistor (T22) 195 is operatively connected to node-4 (200). Node-4 (200) is also disposed to be connected to the drain (D) of a depletion mode MOSFET transistor (T25) 205 which functions as a load device. The gate (G) and source (S) of the transistor (T25) are each connected to ground. In addition, node-4 (200) is connected to the source (S) of an enhancement mode MOSFET transistor (T24) 210 that functions as part of a high-gain differential digital switch. The gate (G) of the transistor (T24) 210 is operatively connected to node-6 (215). The drain (D) of transistor (T24) 210 is connected to the source (S) and gate (G) of a depletion mode MOSFET transistor (T23) 220 that functions as an impedance load. The drain (D) of the transistor (T23) 220 is operatively connected to the predetermined Vcc power supply. The gate (G) and source (S) of the transistor (T23) 220 are also connected to line 225A of the line set 115 outputting to the second stage 120 of the differential digital switching circuit 100.

Line 90 also difurcates to the gate (G) of an enhancement mode MOSFET transistor (T18) 230 that functions as part of a high-gain differential digital switch. The source (S) of the transistor (T18) 230 is operatively connected to a node-7 (235). The drain (D) of the transistor (T-18) 230 is operatively connected to the source (S) and gate (G) of an depletion mode MOSFET transistor (T-20) 240 that functions as an impedance load. The drain (D) of the transistor (T-20) 240 is disposed to be connected to the predetermined Vcc power supply. The source (S) and gate (G) of the transistor (T-20) 240 are also connected to a line 225B of the line set 115 outputting to the second stage 120 of the differential digital switching circuit 100. Node-7 (235) bifurcates first to the source (S) of the enhancement mode MOSFET transistor (T19) 245 that functions as a source follower. The drain (D) of the transistor (T19) 245 is operatively connected to the predetermined Vcc power supply. The gate (G) of the transistor (T19) 245 is disposed to be connected to node-6 (215). Node-6 (215) as described supra is connected via line 110 to the reference voltage circuit 105. The second bifurcation from the node-7 (235) is operatively connected to the drain (D) of a depletion mode MOSFET transistor (T21) 250 which functions as a load device. The gate (G) and the source (S) of the transistor (T-21) 250 are disposed to be connected to ground.

In the specific structure for the second stage 120 of the differential digital switching circuit 100, as also shown in FIGS. 5 and 5A, a node-8 (255) is operative to receive the signal on line 225A of the line set 115 from the first stage 95 of the differential digital switching circuit 100. Node-8 (255) is disposed to be connected to the gate (G) of an enhancement mode MOSFET transistor (T-12) that functions as a low impedance load. The drain (D) of the transistor (T-12) 260 is operatively connected to the predetermined Vcc power supply. The source (S) of the transistor (T-12) 260 is operatively connected to the drains (D) of an enhancement mode MOSFET transistor (T-13) 265 that functions as a single-ended amplifier and an enhancement mode MOSFET transistor 270 (T-17) that functions as part of a cross-coupled latch. Thus the drains (D) of the transistors (T-13) and (T-17) 265 and 270 are connected to each other. The sources (S) of the transistors (T-13) and (T-17) 265 and 270 are connected to each other, and each to ground. The source (S) of the transistor (T-12) 260 also bifurcates to a line 275A of the line set 125 outputting to the output buffer (not shown). The gate (G) of the transistor (T-17) 270 is operatively connected to a line 275B of the line set 125 also to the on-board output buffer (not shown).

The source (S) of the transistor (T-12) 260 also bifurcates to the gate (G) of an enhancement mode MOSFET transistor (T-16) 280 that functions as part of a cross-coupled latch. The gate (G) of the transistor (T-17) 270 also bifurcates to the drains (D) of the transistor (T-16) 280 and an enchancement mode MOSFET transistor (T-15) 285 that functions as a single ended amplifier. The sources (S) of the transistors (T-16) and (T-15) 280 and 285 are operatively connected to ground. The node-8 (255) also bifurcates to the gate (G) of the transistor (T-15) 285. The gate (G) of the transistor (T-13) 265 is disposed to be connected to a node-9 (290). Node-9 (290) is operatively connected to line 225B of the line set 115 from the first stage 95 of the differential digital switching circuit 100. Node-9 (290) is also disposed to be connected to the gate (G) of an enhancement mode MOSFET transistor (T-14) 295 that functions as a relatively low impedance load. The drain (D) of the transistor (T-14) 295 to disposed to be connected to the predetermined Vcc power supply. The gate (G) of the transistor (T-17) is operatively connected to the source (S) of the transistor (T-14) 295.

In the operation of the present invention, as shown in FIG. 2, the transistor (T1) 50 is the memory cell which is driven on the row decode line 30 by a row select/driver (not shown) on-board the ROM memory 5. The programming of the ROM memory 5 is done by the predetermined contact selection at the drain (D) of a memory cell such as the drain (D) of the transistor (T1) 50. The capacitor (C1) 65 includes the bit line capacitance and the drain capacitance of other memory cells on the same bit line or row decode line 30. The transistor (T2) 70 is the transfer gate driven by the column decode line 35 from the column decode/driver (not shown) on-board the ROM memory 5. The capacitor (C2) 80 includes the capacitance of the data bus line and the other 64 transfer gates (not shown) in this embodiment sharing the same data bus line or column decode line 35.

The front end of the sensing amplifier 10 is the common gate amplifier 85 as shown in FIG. 3. It consists of the transistor (T4) 150, the transistor (T6) 140, the transistor (T3) 135, and the transistor (T5) 130. The operation of the common gate amplifier 85 is as given infra. When the column decode line 35 at the gate (G) of the transistor (T2) 70 is relatively low, this implies transistor (T2) 70 is off. Capacitor (C2) 80 at node-2 (75) is charged to one-threshold $V_{TE}$ below the given power supply Vcc by the transistor (T5) 130, the transistor (T6) 140, and the transistor (T4) 150 temporally simultaneously. When the voltage potential across C2 (80) at node-2 (75) reaches Vcc-$V_{TE}$, transistor (T3) 135 cuts off due to the gate (G) voltage at transistor (T3) 135 which is now slightly less than the source (S) voltage by one threshold drop. Node-3 (145) at this time will be pulled to the power supply voltage Vcc relatively very fast temporally by the transistor (T4) 150. Thus the initial condition of the common gate amplifier 85 is set up such that the voltage potential at node-3 (145) is equal to Vcc and the voltage potential at node-2 (75) is equal to Vcc-$V_{TE}$, with the common gate transistor (T3) 135 off, when the column decode line 35 is not active.

The function of transistor (T6) 140 is to clamp the voltage of node-3 (145) to one threshold below power supply Vcc, that is, Vcc$V_{TE}$, when both column decode lines 35 and row decode line 30 are active and the ROM cell such as transistor (T1) 50 is predeterminably programmed. That is, the transistor (T1) 50 is connected to the transistor (T2) 70. It is mainly the ratio of the physical spatial size or dimensions of the transistor (T6) 140 to the transistor (T1) 50 that determines the relative clamping voltage. Thus, if there is a ROM cell predeterminably programmed, such as the transistor (T1) 50, and that the column and row decode lines 35, 30 respectively, are both relatively high, then node-3 (145) will switch from the power supply Vcc to Vcc-$V_{TE}$. If there is no predeterminably programmable bit in the ROM cell, such as the transistor (T1) 50, the voltage at node-3 (145) will remain at Vcc.

The differential digital switching circuit 100, as shown in FIG. 5, comprises transistors T12 through T25, numbered 260, 265, 295, 285, 280, 270, 230, 245, 240, 250, 195, 220, 210 and 205. The transistors (T7) to (T11) and (T26) to (T27) 170, 180, 160, 190, 185, 155 and 165 form the reference voltage circuit 105, as shown in FIG. 4, for differential digital switching circuit 100. The common gate amplifier 85, the digital switching circuit 100 and the reference voltage circuit 105 all are included as part of the sensing amplifier 10. Transistor (T7) 170, transistor (T8) 180 and transistor (T9) 160 form the clamping such that the voltage potential at node-5 (175) is clamped at one threshold $V_{TE}$ below the Vcc power supply. Since the physical spatial sizes of the transistor (T7) 170 is exactly the same as the transistor (T6) 140, the transistor (T8) 180 as that of the transistor (T4) 150, and the transistor (T9) 160 as that of the transistor (T1) 50, therefore the reference voltage circuit 105 constitutes a matching reference voltage (as to the common gate circuit 85) and the voltage at node-3 (145) and that of node5 (175) will track each other even for processing variation due to fabrication differences. The transistor (T10) 190 and the transistor (T11) 185 form a voltage divider, so that the voltage potential at node-6 (215) is one half times the threshold below the Vcc power supply. That is, voltage at node-6 (215) equals Vcc minus ($V_{TE}$ divided by two). Transistor (T22) 195 and its load device transistor (T25) 205 comprise a source follower, as does transistor (T19) 245 and its load device transistor (T21) 250. These source followers operate to step down the voltage at node-3 (145) and at node-6 (215) by one threshold respectively. That is voltage at node-4 (200) equals voltage at node-3 (145) minus $V_{TE}$, voltage at node-7 (235) equals voltage at node-6 (215) minus $V_{TE}$. Since node-6 (215) is the reference voltage, it is always set at a voltage at node-6 (215) that equals Vcc minus ($V_{TE}$ divided by two), therefore voltage at node-7 (235) equals Vcc minus ($V_{TE}$ times three halves).

The two general sets of equations for the operations of the differential digital switching circuit 100 are as follows infra. In the first general equation set, when voltage at node-3 (145) equals Vcc, voltage at node-4 (200) equals Vcc minus $V_{TE}$ equals voltage at source (S) of transistor (T24) 210, voltage at gate (G) of transistor (T24) 210 equals voltage at node-6 (215) equals Vcc minus $V_{TE}$ divided by two. Therefore transistor (T24) 210 equals cutoff. This implies that voltage at node-8 (255) equals Vcc.

Corrolaries to the first equation set include the voltage at node-7 (235) equals voltage at the source (S) of transistor (T18) 230 equals Vcc minus three halves times $V_{TE}$. Voltage at gate (G) of transistor (T18) 230 equals voltage at node-3 (135) equals the Vcc power supply. Therefor the transistor (T18) equals on. This implies that the voltage potential at node-9 (290) equals the Vcc power supply minus three halves times $V_{TE}$.

From the above, the second equation set follows as given infra. When the voltage at node-3 (135) equals Vcc minus $V_{TE}$, voltage at node-4 (200) equals voltage at the source of the transistor (T24) 210 in turn equals Vcc minus two times $V_{TE}$. Voltage at gate (G) of the transistor (24) 210 equals voltage at the node-6 (215) in turn equals Vcc minus $V_{TE}$ divided by two. Therefor transistor (T24) 210 equals on. This implies that the voltage at the node-8 (255) equals Vcc minus two times $V_{TE}$.

Corrolaries to the second equation set include the voltage at node-7 (235) eqùals the voltage at the source (S) of the transistor (T18) 230 equals Vcc minus three halves $V_{TE}$. The voltage at the gate (G) of the transistor (T18) 230 equals Vcc minus $V_{TE}$. Therefor transistor (T18) 230 equals off. This implies that the voltage at node-9 (290) equals Vcc plus.

Thus, the differential digital switching technique is accomplished when the voltage at node-3 (145) switches from Vcc to Vcc minus $V_{TE}$. When this is done, the signal on line set 115 is operative to continue from the output nodes of the first stage 95 or input nodes for the second stage 120, that is the voltage at the node-8 (255) and the voltage at node-9 (290), to the second stage 120 which is a cross-coupled amplifier and then on to the output buffer (not shown) on line set 125.

In FIG. 6, a table is shown summarizing the results a computer simulation of the present invention under various process parameters. For WE/WD, $V_{TE}=1.1$ and $V_{TD}=-2.5$. For WE/BD, $V_{TE}=1.1$ and $V_{TD}=-3.5$. For BE/BD, $V_{TE}=0.6$ and $V_{TD}=-3.5$. For BE/WD, $V_{TE}=0.6$ and $V_{TD}=-2.5$. WE is worst case enhancement device. BE is best case enhancement device. WD is worst case depletion device. BD is best case depletion device. Assumptions include temperature equals 85 degrees centrigrade and 100 percent loading on the bit line. T(RISE) and T(FALL) are the rise time and fall times respectively of the address line. Specifically, T(RISE) is the regular enhancement device pull-up row-drive low-to-high. Also, T(FALL) is the regular enhancement device pull-up row-driver high-to-low.

It will be appreciated that the common gate amplifier 85 (and memory cell 20) and the voltage reference circuit 105 have their individual components spatially matched. Which is to say that the physical size of analogous transistors as to the two circuits 85, 105 is precisely the same as to dimensional matching thereby disallowing variations in a given process that might affect the stability of the reference voltage as outputted on line 110. In particular, the transistor (T9) 160 is analogous to the transistor (T1) 50. The transistor (T7) 170 is analogous to the transistor (T6) 140. The transistor (T8) 180 is analogous to the transistor (T4) 150.

While the above referenced embodiments of the invention have been described in considerable detail with respect to the apparatus, it will be appreciated that other modifications and variations therein may be made by those skilled in the art without departing from the true spirit and scope of the invention.

What is claimed is:

1. A memory system comprising:
   a plurality of memory cell transistors, each of which produces an output bit signal at its drain which is either high or low,
   a decoding means for selecting one output bit signal,
   an amplifier comprising:
   (1) a first impedance load connected to a supply voltage,
   (2) a first transistor coupling said first load to said decoding means output,
   (3) a first clamp to prevent the voltage at the point between said first impedance and said first transistor to drop below a predetermined voltage,
   a reference voltage generator comprising:
   (1) a second impedance load generally similar to said first load, connected to said supply voltage,
   (2) a reference transistor coupled to said second load to produce a low output bit reference signal, said reference transistor being generally similar to said memory cell transistors,
   (3) a second clamp to prevent the voltage at the point between said second impedance and said reference transistor to drop below said predetermined voltage, and
   (4) a voltage divider to produce a reference voltage halfway between said supply voltage and the voltage at the point between said reference transistor and said second clamp, and
   a differential amplifier where one input is the voltage at said first clamp and the second input is the reference voltage.

2. The system of claim 1 wherein said clamps are enhancement transistors, said loads are depletion transistors, and wherein the gates and drains of said clamps and loads are connected to said supply voltage, and each clamp and load source is coupled to its associated differential amplifier input.

3. The system of claim 2 wherein said voltage divider comprises two transistors in series, each with its source connected to its gate, the drain of one connected to said supply voltage, the source and gate of the other connected to said reference transistor, and the remaining source, gate and drain connected to the second input of said differential amplifier.

4. The system of claim 2 wherein said differential amplifier comprising:

first and second means for reducing said first and second input voltages by one threshold voltage, generating third and fourth voltages, a first switching transistor, the source coupled to said third voltage, the gate coupled to said second voltage, and the drain coupled through an impedance to a supply voltage, and a second switching transistor, the source coupled to said fourth voltage, the gate coupled to said first voltage, and the drain coupled through an impedance to a supply voltage, wherein the differential output is taken from the first and second transistor drains.

5. The system of claim 3 wherein said differential amplifier comprising:

first and second means for reducing said first and second input voltages by one threshold voltage, generating third and fourth voltages, a first switching transistor, the source coupled to said third voltage, the gate coupled to said second voltage, and the drain coupled through an impedance to a supply voltage, and a second switching transistor, the source coupled to said fourth voltage, the gate coupled to said first voltage, and the drain coupled through an impedance to a supply voltage, wherein the differential output is taken from the first and second transistor drains.

* * * * *